US011917806B2

(12) United States Patent
Wang et al.

(10) Patent No.: US 11,917,806 B2
(45) Date of Patent: Feb. 27, 2024

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Xiaoling Wang, Hefei (CN); Hai-Han Hung, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 372 days.

(21) Appl. No.: 17/453,043

(22) Filed: Nov. 1, 2021

(65) Prior Publication Data
US 2023/0047359 A1 Feb. 16, 2023

Related U.S. Application Data

(63) Continuation of application No. PCT/CN2021/113289, filed on Aug. 18, 2021.

(30) Foreign Application Priority Data

Aug. 12, 2021 (CN) .......................... 202110926631.6

(51) Int. Cl.
H01L 21/3065 (2006.01)
H01L 49/02 (2006.01)
H10B 12/00 (2023.01)

(52) U.S. Cl.
CPC ..... *H10B 12/038* (2023.02); *H01L 21/30655* (2013.01); *H01L 28/60* (2013.01);
(Continued)

(58) Field of Classification Search
CPC ... H01L 28/60; H01L 21/28; H01L 21/28105; H01L 21/7687; H01L 21/30655;
(Continued)

(56) References Cited

U.S. PATENT DOCUMENTS 6,831,323 B2 * 12/2004 Ito ........................... H01L 28/91
257/306
6,917,067 B2 * 7/2005 Park ..................... H10B 12/485
257/E21.507
(Continued)

FOREIGN PATENT DOCUMENTS

CN 104282561 A 1/2015
CN 107527909 A 12/2017
(Continued)

OTHER PUBLICATIONS

International Search Report cited in PCT/CN2021/113289, dated May 7, 2022, 9 pages.

*Primary Examiner* — Eduardo A Rodela
(74) *Attorney, Agent, or Firm* — Cooper Legal Group, LLC

(57) ABSTRACT

The present disclosure provides a method of manufacturing a semiconductor structure and a semiconductor structure, relating to the technical field of semiconductors. The method of manufacturing a semiconductor structure includes: providing a substrate; forming multiple active pillars arranged in an array on the substrate, where an outer surface layer of each of the active pillars has a concave-convex surface; forming a gate oxide layer on the substrate, where a filling region is formed between two adjacent active pillars in the same row; forming a word line and a first dielectric layer in the filling region; exposing a top surface of each of the active pillars; forming a contact layer on the top surface of each of the active pillars; and forming a capacitor structure on the contact layer.

17 Claims, 12 Drawing Sheets

(52) U.S. Cl.
CPC ......... *H10B 12/315* (2023.02); *H10B 12/482* (2023.02); *H10B 12/488* (2023.02)

(58) Field of Classification Search
CPC ........... H01L 21/76877; H01L 27/0805; H01L 27/1255; H01L 28/82; H01L 28/84; H01L 23/5223; H10B 12/315
See application file for complete search history.

(56) References Cited

U.S. PATENT DOCUMENTS

| | | | | |
|---|---|---|---|---|
| 7,056,786 | B2* | 6/2006 | Yun | H01L 21/76895 |
| | | | | 257/E21.507 |
| 7,056,788 | B2* | 6/2006 | Nakamura | H10B 12/315 |
| | | | | 438/254 |
| 7,915,736 | B2* | 3/2011 | Kirby | H01L 21/76898 |
| | | | | 257/E21.597 |
| 8,049,327 | B2* | 11/2011 | Kuo | H01L 23/481 |
| | | | | 257/621 |
| 8,557,666 | B2* | 10/2013 | Wei | H01L 21/823418 |
| | | | | 438/294 |
| 9,391,073 | B2 | 7/2016 | Mn et al. | |
| 9,761,592 | B2* | 9/2017 | Chang | H01L 23/5223 |
| 10,079,277 | B2* | 9/2018 | Yew | H01L 21/31116 |
| 10,312,156 | B2 | 6/2019 | Jeong et al. | |
| 10,784,334 | B2* | 9/2020 | Chang | H01L 28/88 |
| 10,910,379 | B2 | 2/2021 | Tang et al. | |
| 2005/0082637 | A1* | 4/2005 | Mikawa | H01L 21/7687 |
| | | | | 257/532 |
| 2005/0112891 | A1 | 5/2005 | Johnson et al. | |
| 2007/0231997 | A1 | 10/2007 | Doyle et al. | |
| 2010/0244191 | A1* | 9/2010 | Yu | H01L 21/76895 |
| | | | | 257/532 |
| 2019/0288033 | A1 | 9/2019 | Sukekawa | |

FOREIGN PATENT DOCUMENTS

| | | |
|---|---|---|
| CN | 110957319 A | 4/2020 |
| CN | 111697054 A | 9/2020 |

\* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Patent Application No. PCT/CN2021/113289, filed on Aug. 18, 2021, which claims the priority to Chinese Patent Application No. 202110926631.6, titled "METHOD OF MANUFACTURING SEMICONDUCTOR STRUCTURE AND SEMICONDUCTOR STRUCTURE" and filed on Aug. 12, 2021. The entire contents of International Patent Application No. PCT/CN2021/113289 and Chinese Patent Application No. 202110926631.6 are incorporated herein by reference.

TECHNICAL FIELD

The present disclosure relates to, but is not limited to, a method of manufacturing a semiconductor structure and a semiconductor structure.

BACKGROUND

The dynamic random access memory (DRAM) has a small size, a high degree of integration, and low power consumption, and is faster than all read-only memory (ROM). With the development of the semiconductor industry, to optimize the integration is one of the main goals of the circuit design. However, with the continuous scaling of the critical dimension of the DRAM and other devices, the size of transistors is getting smaller, the gate control capability of the transistors is weakened, and the short-channel effect becomes more obvious, thus reducing the performance of the semiconductor structure.

SUMMARY

An overview of the subject matter detailed in the present disclosure is provided below, which is not intended to limit the protection scope of the claims.

The present disclosure provides a method of manufacturing a semiconductor structure and a semiconductor structure.

According to a first aspect, the embodiments of the present disclosure provide a method of manufacturing a semiconductor structure. The method of manufacturing a semiconductor structure includes:

providing a substrate;

forming multiple active pillars on the substrate, where the multiple active pillars are arranged in an array, and an outer surface layer of each of the active pillars has a concave-convex surface;

forming a gate oxide layer on the substrate, wherein the gate oxide layer covers a top surface of the substrate and sidewalls and a top surface of each of the active pillars, and a filling region is formed between two adjacent active pillars in the same row;

sequentially forming a word line and a first dielectric layer in the filling region;

removing a part of the first dielectric layer and a part of the gate oxide layer, to expose the top surface of each of the active pillars;

forming a contact layer on the top surface of each of the active pillars; and forming a capacitor structure on the contact layer.

According to a second aspect, the embodiments of the present disclosure provide a semiconductor structure, which is obtained by the foregoing method of manufacturing a semiconductor structure. The semiconductor structure includes:

a substrate;

multiple active pillars, where the multiple active pillars are arranged in an array on the substrate, and an outer surface layer of each of the active pillars has a concave-convex surface.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person of ordinary skill in the art may still derive other drawings from these accompanying drawings without creative efforts.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that without conflict, the embodiments in the present disclosure and features in the embodiments may be combined with each other.

In the semiconductor structure, with the continuous scaling of the critical dimension of the DRAM and other devices, the size of transistors is getting smaller, the gate control ability of the transistors is weakened, and the short-channel effect becomes more obvious, thus greatly reducing the performance of the semiconductor structure.

In view of the foregoing technical problem, in the method of manufacturing a semiconductor structure and the semiconductor structure provided by the embodiments of the present disclosure, a concave-convex surface is formed on the outer surface layer of each of the active pillars, which increases the specific surface area of the gate oxide layer and improves the control capability of the gate, thus improving the performance of the semiconductor structure.

Figure 1:
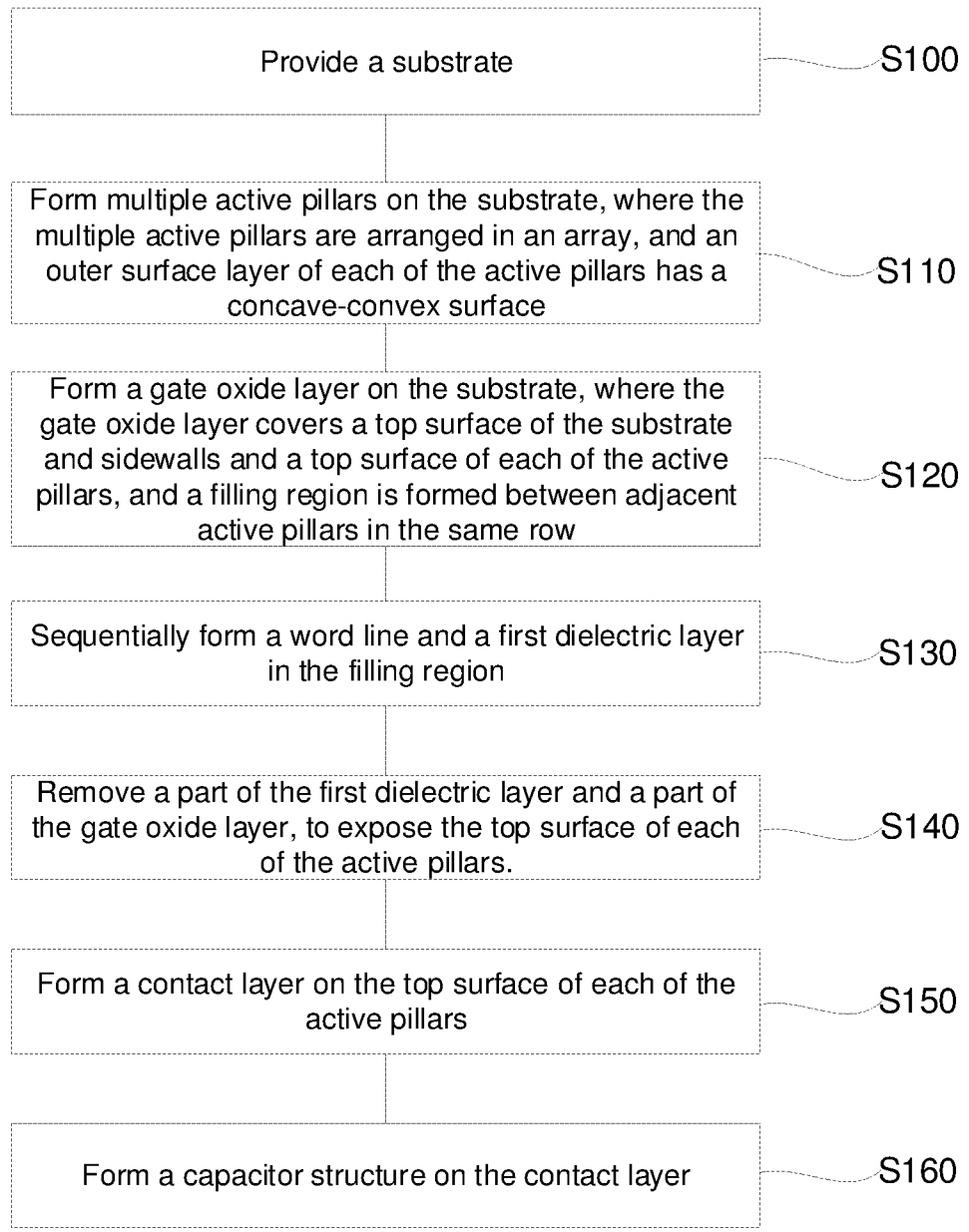
FIG. 1 is a flowchart of a method of manufacturing a semiconductor structure according to an exemplary embodiment.

An exemplary embodiment of the present disclosure provides a method of manufacturing a semiconductor structure, as shown in FIG. 1. FIG. 1 shows a flowchart of a method of manufacturing a semiconductor structure according to an exemplary embodiment of the present disclosure. FIG. 2 to FIG. 20 are schematic diagrams of various stages of the method of manufacturing a semiconductor structure. The method of manufacturing a semiconductor structure is described below with reference to FIG. 2 to FIG. 20.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

As shown in FIG. 1, a method of manufacturing a semiconductor structure provided by an embodiment of the present disclosure includes the following steps:

Step S100: Provide a substrate.

Step S110: Form multiple active pillars on the substrate, where the multiple active pillars are arranged in an array, and an outer surface layer of each of the active pillars has a concave-convex surface.

Step S120: Form a gate oxide layer on the substrate, where the gate oxide layer covers a top surface of the substrate and sidewalls and a top surface of each of the active pillars, and a filling region is formed between two adjacent active pillars in the same row.

Step S130: Sequentially form a word line and a first dielectric layer in the filling region.

Step S140: Remove a part of the first dielectric layer and a part of the gate oxide layer, to expose the top surface of each of the active pillars.

Step S150: Form a contact layer on the top surface of each of the active pillars.

Step S160: Form a capacitor structure on the contact layer.

Figure 2:
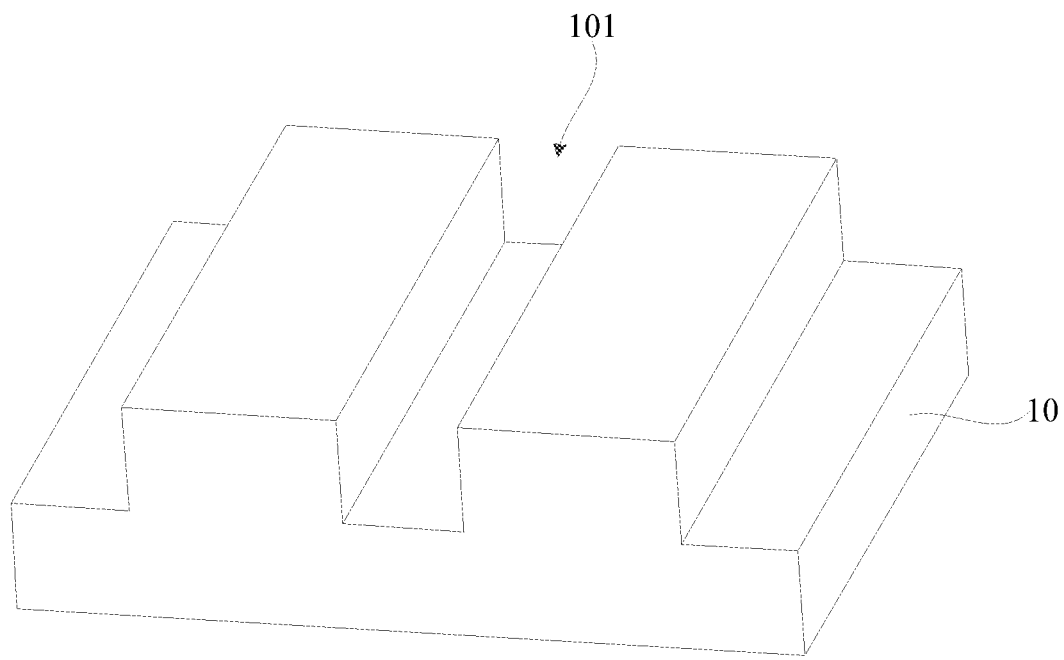
FIG. 2 is a schematic diagram of forming first grooves in a substrate in a method of manufacturing a semiconductor structure according to an exemplary embodiment.

For example, in step S100, as shown in FIG. 2, the substrate 10 serves as a support member of a memory and is used to support other components provided thereon. The substrate 10 may be made of a semiconductor material. The semiconductor material may be one or more of the following: silicon, germanium, silicon-germanium, and silicon-carbon.

Figure 5:
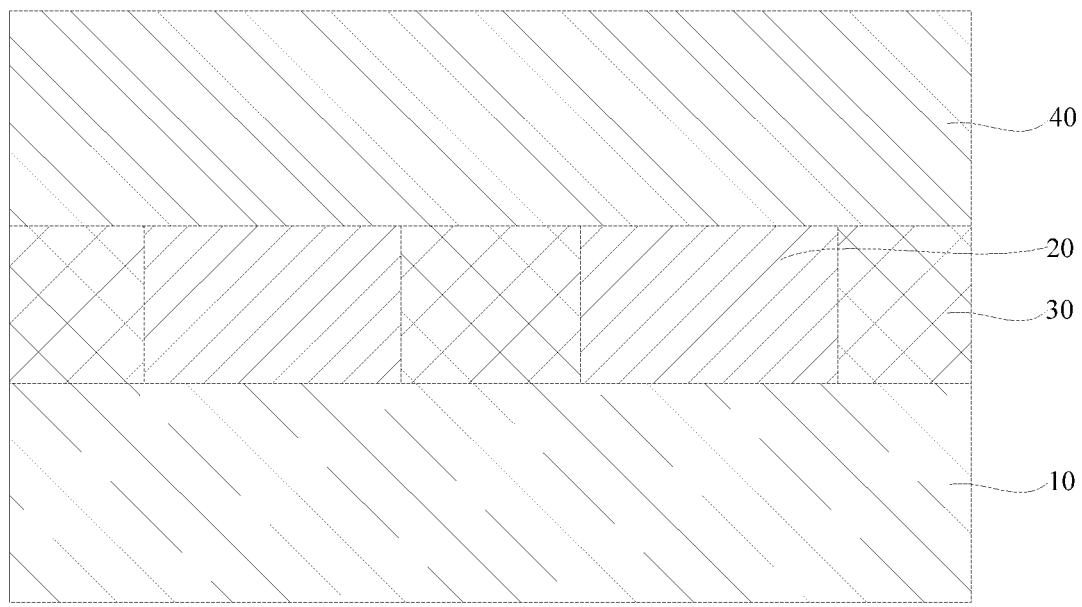
FIG. 5 is a schematic diagram of forming an etching sacrificial layer in a method of manufacturing a semiconductor structure according to an exemplary embodiment.
Figure 6:
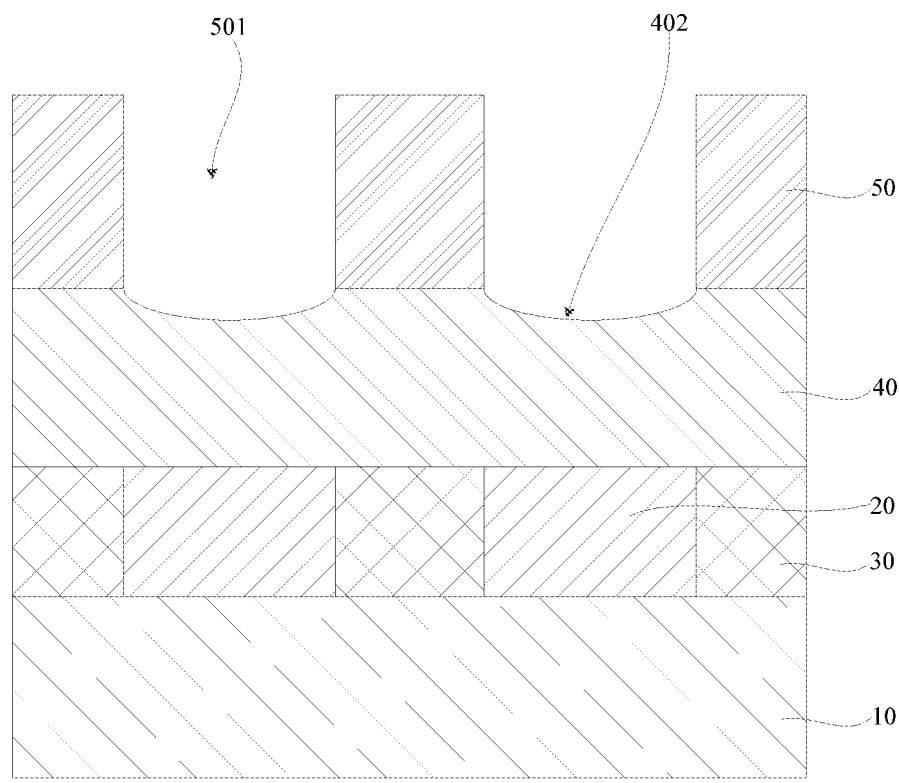
FIG. 6 is a schematic diagram of forming third grooves and recesses in a method of manufacturing a semiconductor structure according to an exemplary embodiment.

In step S110, as shown in FIG. 5 and FIG. 6, an etching sacrificial layer 40 and a photoresist layer 50 that are stacked may be formed on the substrate 10 first. In some embodiments, the etching sacrificial layer 40 and the photoresist layer 50 which are stacked can be formed on the substrate 10 by an atomic layer deposition process, a chemical vapor deposition process, or a physical vapor deposition process. A material of the etching sacrificial layer 40 includes silicon oxide or the like.

As shown in FIG. 6, a part of the photoresist layer 50 is removed first, such that the retained photoresist layer 50 forms multiple third grooves 501 arranged at intervals, where each of the third grooves 501 exposes the top surface of the etching sacrificial layer 40. The multiple third grooves 501 are arranged in an array, to facilitate subsequent formation of the active pillars.

Figure 10:
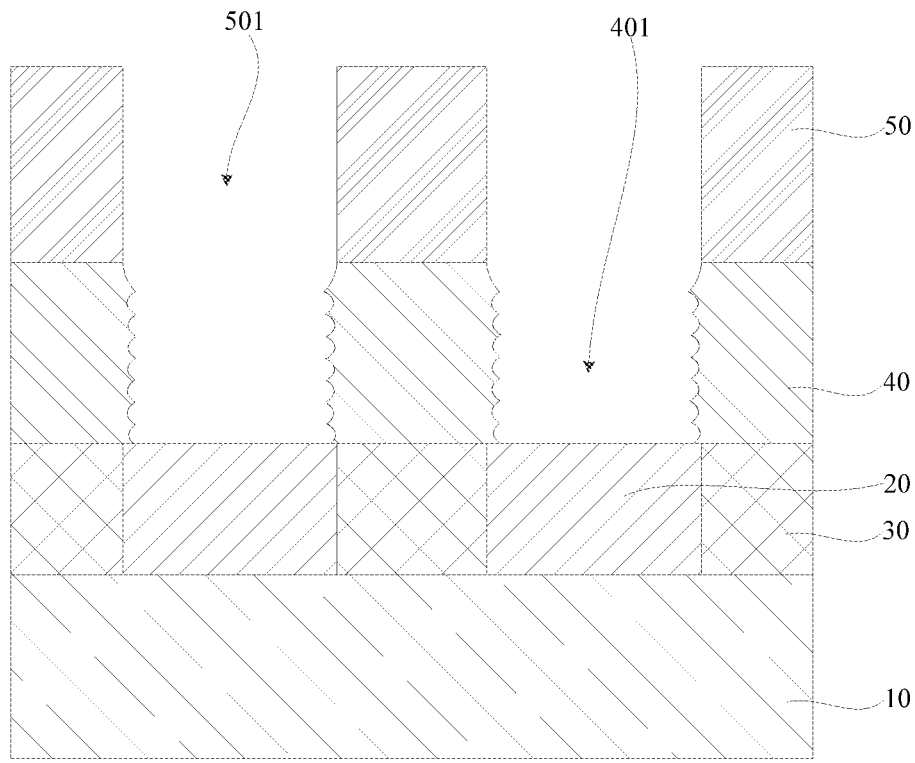
FIG. 10 is a schematic diagram of forming second grooves in a method of manufacturing a semiconductor structure according to an exemplary embodiment.

As shown in FIG. 10, after the third grooves 501 are formed, by using the photoresist layer 50 as a mask plate, the etching sacrificial layer 40 exposed in each of the third grooves 501 is removed repeatedly, where the etching sacrificial layer 40 in each of the third grooves 501 is removed by a predetermined thickness each time, such that the etching sacrificial layer 40 forms second grooves 401. Each of the second grooves 401 exposes the top surface of the substrate 10, such that a concave-convex inner wall is formed on an inner wall of each of the second grooves 401.

In some embodiments, as shown in FIG. 7 to FIG. 10, a forming process of the second grooves 401 is as follows:

The etching sacrificial layer 40 in each of the third grooves 501 is removed by a predetermined thickness first, to form a recess 402 on the top surface of the etching sacrificial layer 40. In some embodiments, along a lengthwise section perpendicular to the top surface of the substrate 10, each of the recesses 402 is a semioval-shaped groove.

Figure 7:
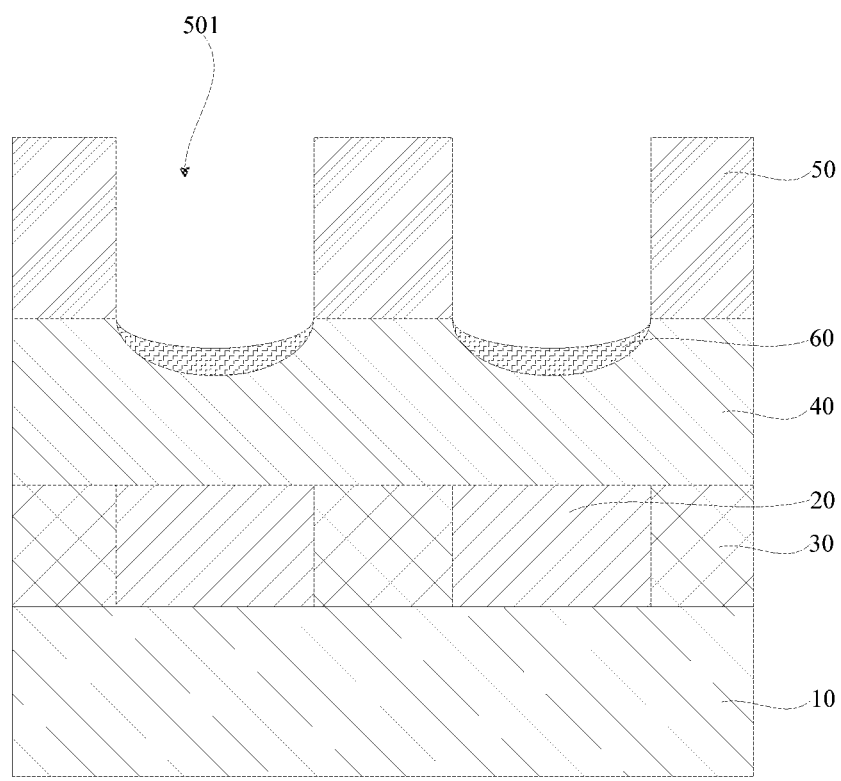
FIG. 7 is a schematic diagram of forming a barrier layer in a method of manufacturing a semiconductor structure according to an exemplary embodiment.

A barrier layer 60 is formed in each of the recesses 402. For example, as shown in FIG. 7, oxygen may be introduced to each of the third grooves 501 to oxidize the etching sacrificial layer 40 on the surface of the recess 402, or a silicon nitride layer may be deposited on the surface of the recess 402. An oxide layer or a silicon nitride layer forms the barrier layer 60.

Figure 8:
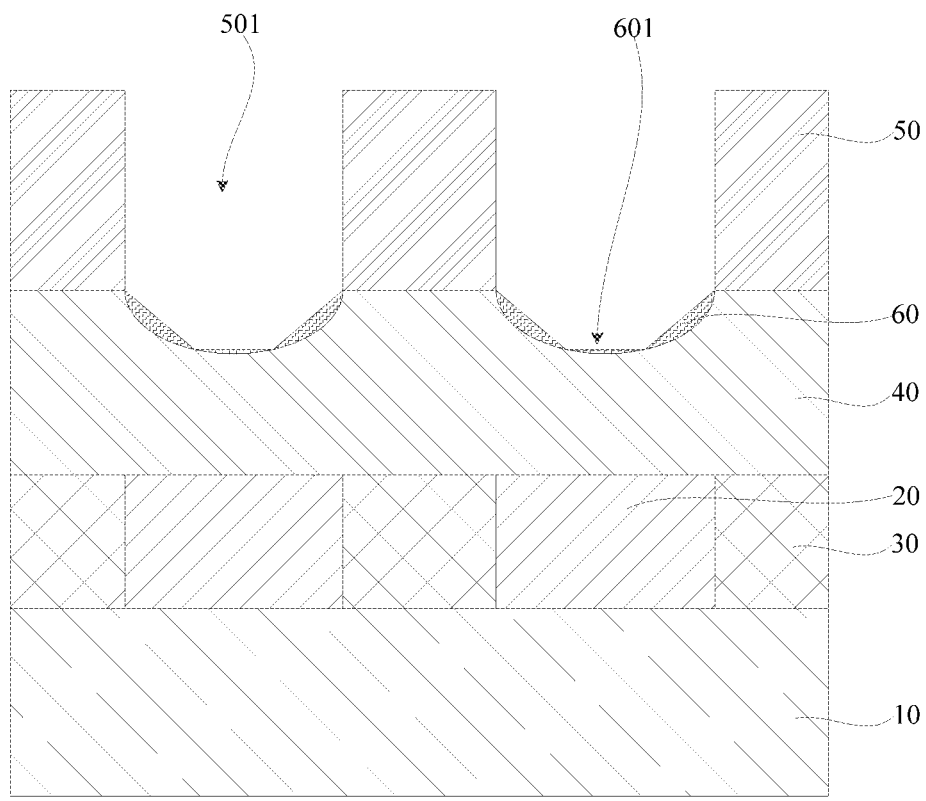
FIG. 8 is a schematic diagram of forming first openings in a method of manufacturing a semiconductor structure according to an exemplary embodiment.

The barrier layer 60 at the bottom of each of the recesses 402 is removed, such that the retained barrier layer 60 forms a first opening 601, where a bottom surface of the first opening 601 exposes the etching sacrificial layer 40. In some embodiments, the barrier layer 60 at the bottom of each of the recesses 402 can be anisotropically etched by using plasma etching gas containing chlorofluorocarbons to form the first opening 601, and the bottom of the first opening 601 rests on an upper surface of the etching sacrificial layer 40, as shown in FIG. 8.

The etching sacrificial layer 40 exposed in each of the first openings 601 is removed by a predetermined thickness, to form a second opening 602. The depth of the first opening 601 may be the same as or different from that of the second opening 602, and the top surface of the etching sacrificial layer 40 located in each of the second openings 602 is higher than the bottom surface of the substrate 10.

Figure 9:
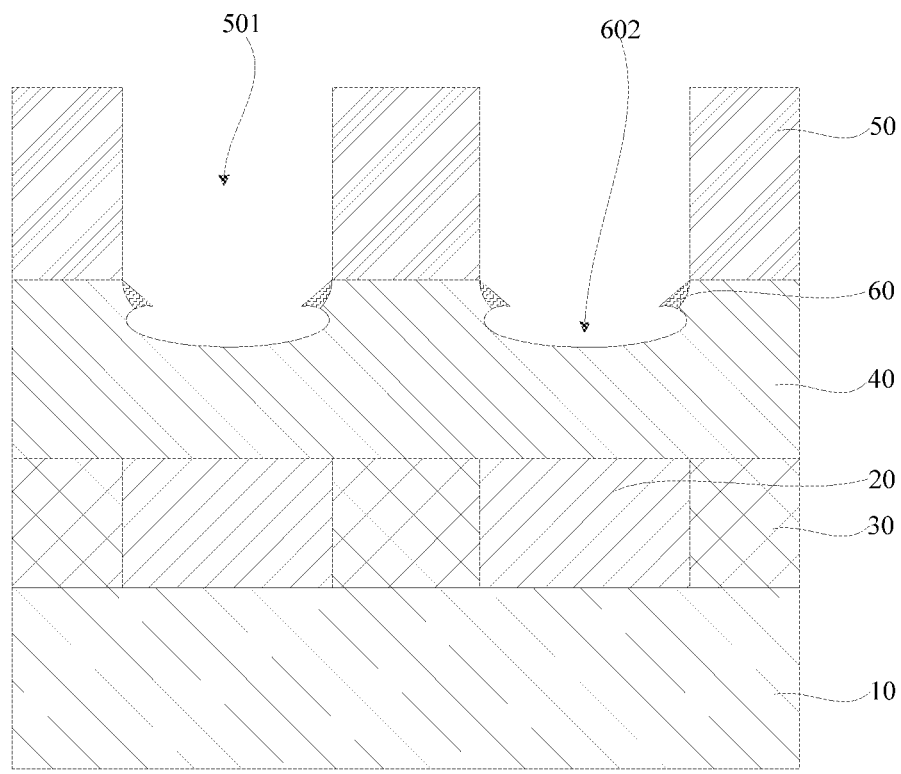
FIG. 9 is a schematic diagram of forming second openings in a method of manufacturing a semiconductor structure according to an exemplary embodiment.

In some embodiments, as shown in FIG. 9, the etching sacrificial layer 40 in each of the first openings 601 can be etched by using plasma etching gases of chlorine and bromine compounds. The upper surface of the etching sacrificial layer 40 in each of the first openings 601 is used as a starting point for etching, and the sidewalls and bottom of the etching sacrificial layer 40 are etched anisotropically towards the substrate 10, thus forming the second openings 602.

For example, as shown in FIG. 10, the process of removing the etching sacrificial layer 40 by a predetermined thickness in the foregoing embodiment is repeated. It should be noted that, when the etching sacrificial layer 40 is removed by the predetermined thickness each time, the recess 402 formed on the top surface of the previously retained etching sacrificial layer 40 is used as a starting point, until the top surface of the substrate 10 is exposed. The retained etching sacrificial layer 40 forms multiple second grooves 401 arranged in an array, and the retained etching sacrificial layer 40 forms a concave-convex inner wall inside each of the second grooves 401.

The etching sacrificial layer 40 in each of the second openings 602 is repeatedly removed by the predetermined thickness, until the top surface of the substrate 10 is exposed. Then, hydrofluoric acid or phosphoric acid is introduced into each of the second openings 602 to remove the barrier layer 60 retained on the surface of each of the first openings 601.

Figure 11:
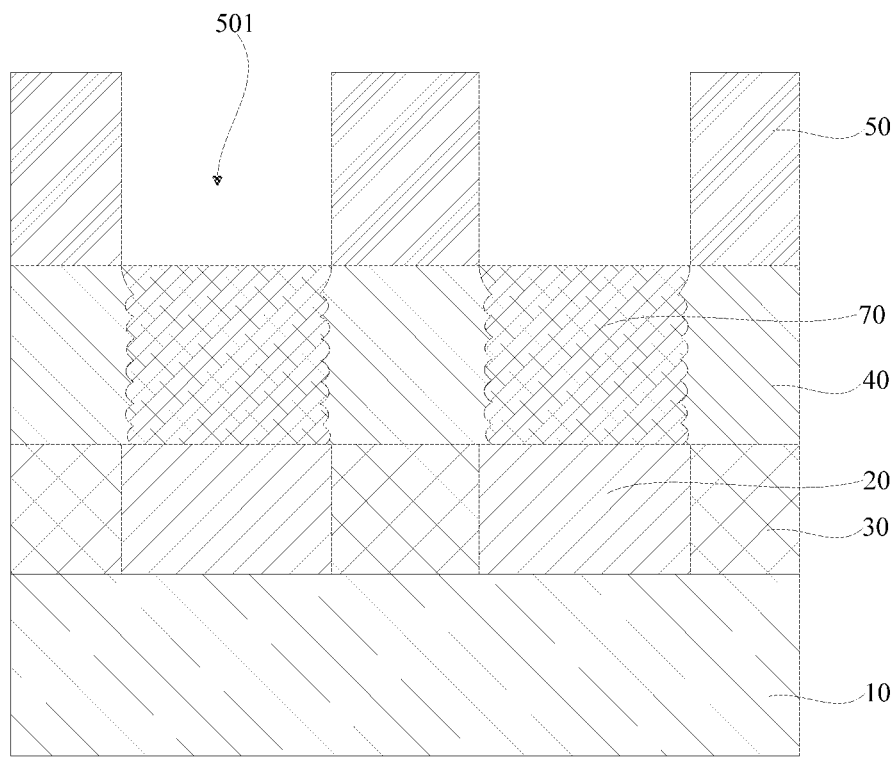
FIG. 11 is a schematic diagram of forming active pillars in a method of manufacturing a semiconductor structure according to an exemplary embodiment.

As shown in FIG. 11, the active pillars 70 are formed in the second grooves 401 respectively. A top surface of each of the active pillars 70 is flush with the top surface of the etching sacrificial layer 40. In some embodiments, the active pillars 70 may be formed by silicon epitaxial growth along the concave-convex inner walls of the second grooves 401. The outer surface layer of each of the active pillars 70 forms a concave-convex surface along the concave-convex inner wall of the second groove 401. In projection of each of the active pillars 70 on a lengthwise section perpendicular to the top surface of the substrate 10, along a height extension direction of the active pillar 70, the concave-convex surface includes multiple circular arc bumps 71 that are sequentially connected.

Figure 12:
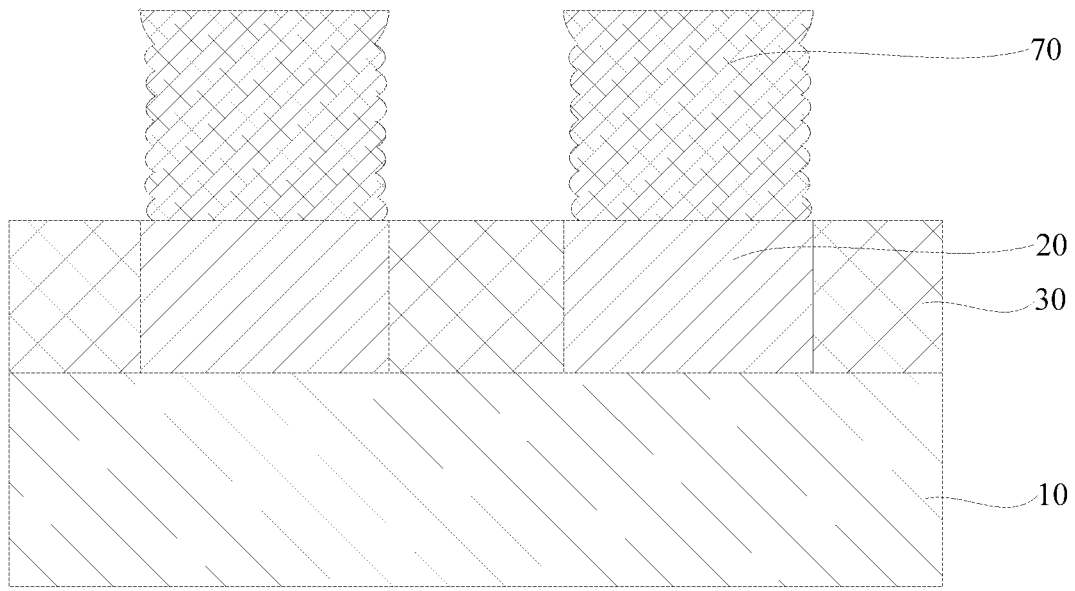
FIG. 12 is a schematic diagram of active pillars in a method of manufacturing a semiconductor structure according to an exemplary embodiment.

Then, the retained photoresist layer 50 and the retained etching sacrificial layer are removed, such that the outer surface layer of each of the active pillars 70 forms the concave-convex surface, as shown in FIG. 12. By forming the concave-convex surface on the outer surface layer of each of the active pillars 70, the specific surface area of the subsequently formed gate oxide layer is increased, so as to improve the gate control capability and short-channel control performance of the semiconductor structure, thus improving the performance of the semiconductor.

Figure 13:
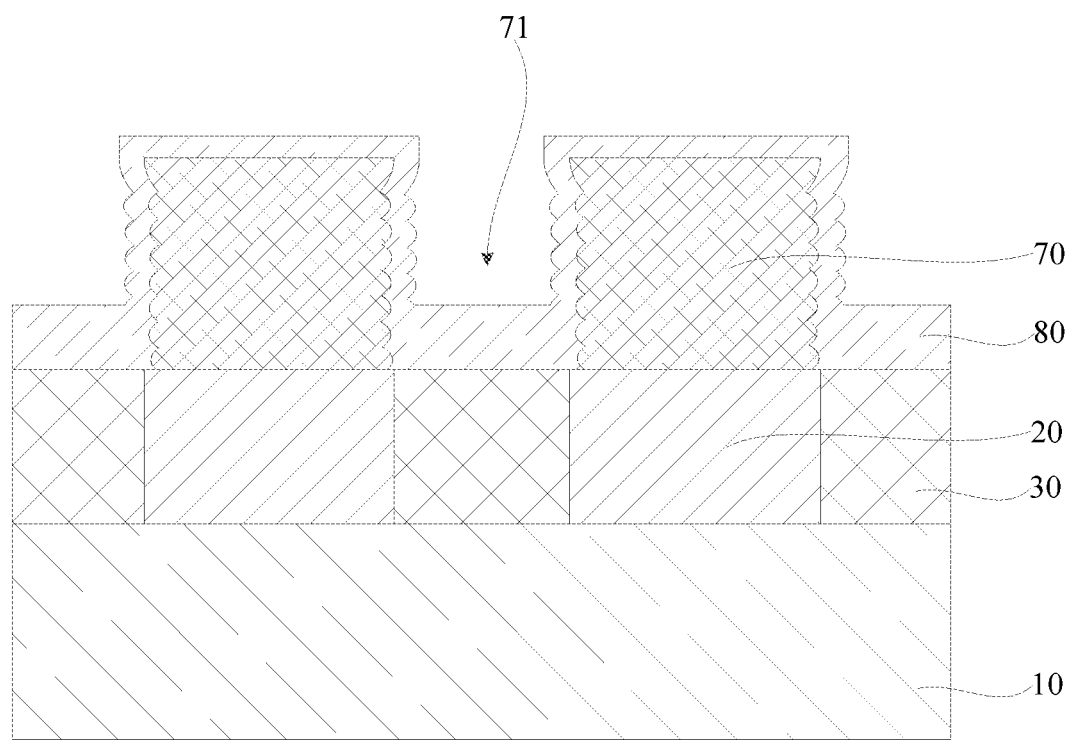
FIG. 13 is a schematic diagram of forming a gate oxide layer in a method of manufacturing a semiconductor structure according to an exemplary embodiment.

For example, in step S120, as shown in FIG. 13, a silicon dioxide layer may be formed on the sidewalls and top surface of each of the active pillars 70 and the surface of the substrate 10, where the silicon dioxide layer may be formed by a chemical vapor deposition process. The silicon dioxide layer is then partially removed by wet etching, and finally the top surface and sidewalls of each of the active pillars 70 are dry oxidized to form the gate oxide layer 80. At the same time, a filling region 701 is formed between two adjacent active pillars 70 in the same row.

Figure 14:
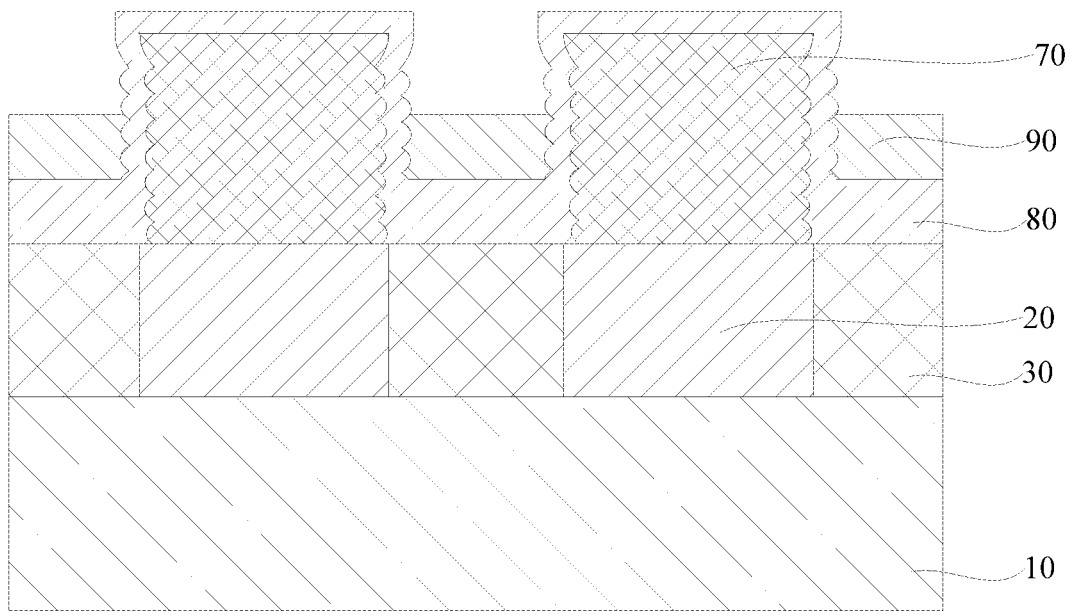
FIG. 14 is a schematic diagram of forming word lines in a method of manufacturing a semiconductor structure according to an exemplary embodiment.
Figure 15:
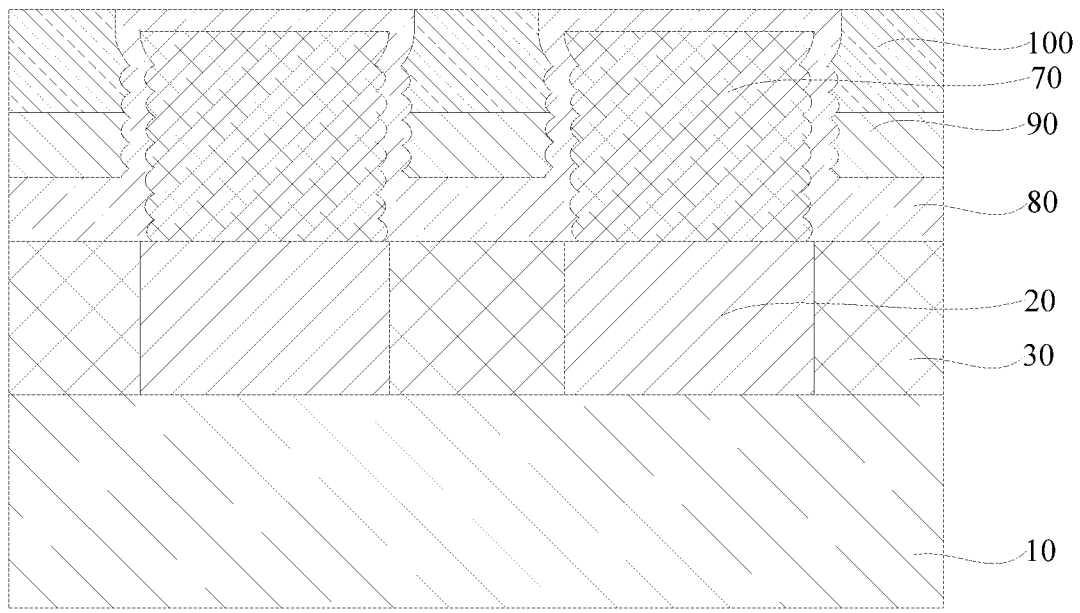
FIG. 15 is a schematic diagram of forming a first dielectric layer in a method of manufacturing a semiconductor structure according to an exemplary embodiment.

For example, in step S130, as shown in FIG. 14 and FIG. 15, a word line 90 is formed on the surface of the gate oxide layer 80, i.e., within each of the filling regions 701. Each of the word lines 90 is a metal layer, which includes at least one of a tungsten layer, a copper layer, or a titanium nitride layer. The top surface of each of the formed word lines 90 is lower than the top surface of each of the active pillars 70.

A first dielectric layer 100 is formed on each of the word lines 90, where the first dielectric layer 100 covers the top surface of the word line 90 and the top surface and sidewalls of the gate oxide layer 80. A material of the first dielectric layer 100 includes silicon dioxide or the like.

Figure 16:
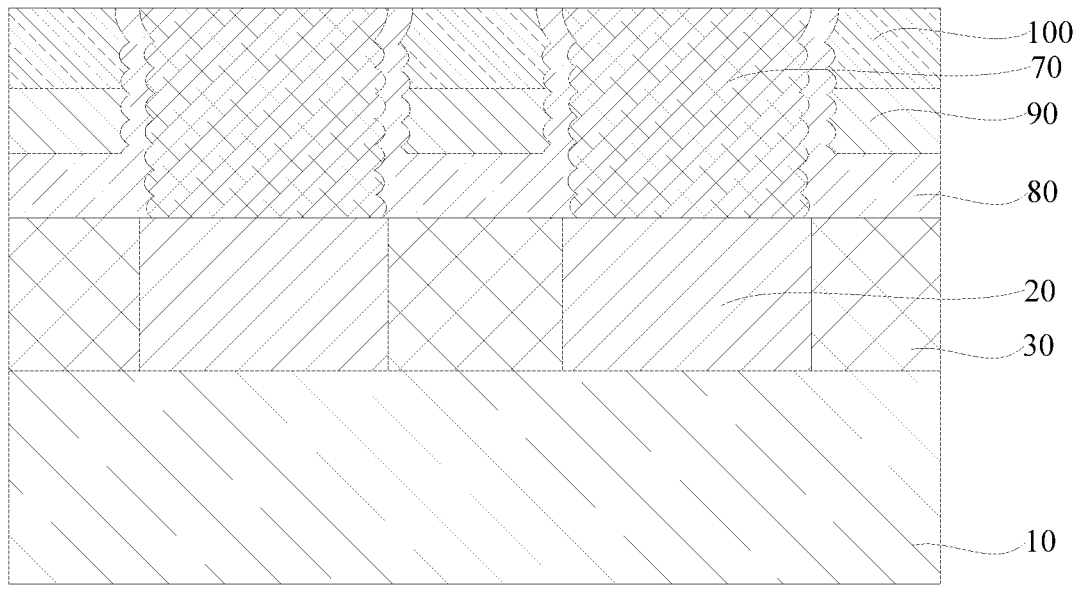
FIG. 16 is a schematic diagram of removing a part of a gate oxide layer and a part of each first dielectric layer in a method of manufacturing a semiconductor structure according to an exemplary embodiment.

For example, in step S140, as shown in FIG. 16, a part of the first dielectric layer 100 and a part of the gate oxide layer 80 are removed by chemical mechanical grinding, and the top surface of each of the active pillars 70 is exposed.

Figure 17:
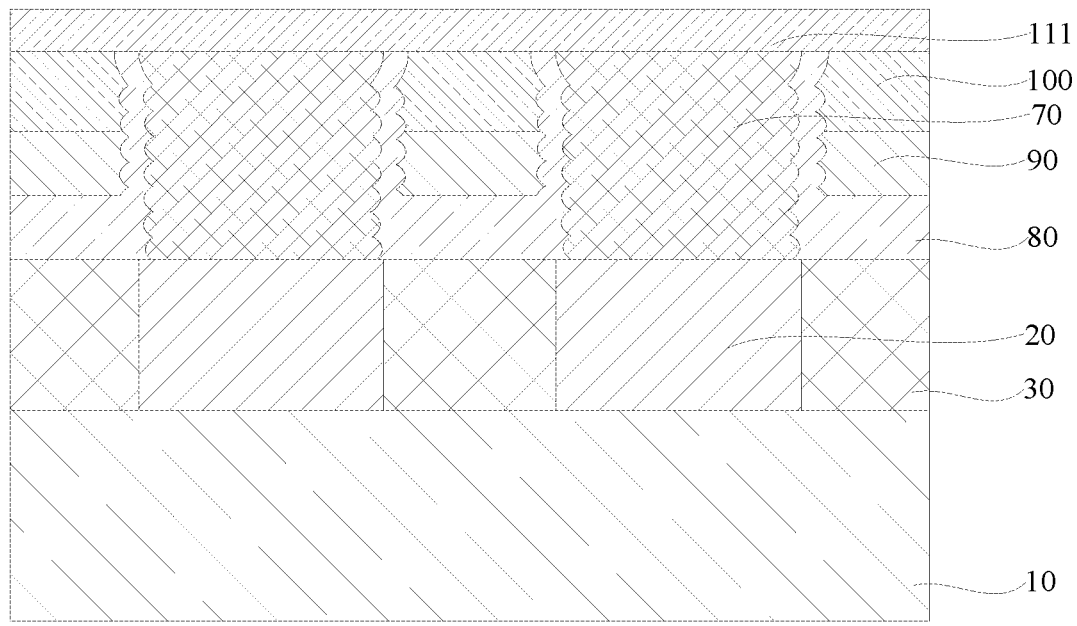
FIG. 17 is a schematic diagram of forming an initial metal layer in a method of manufacturing a semiconductor structure according to an exemplary embodiment.
Figure 18:
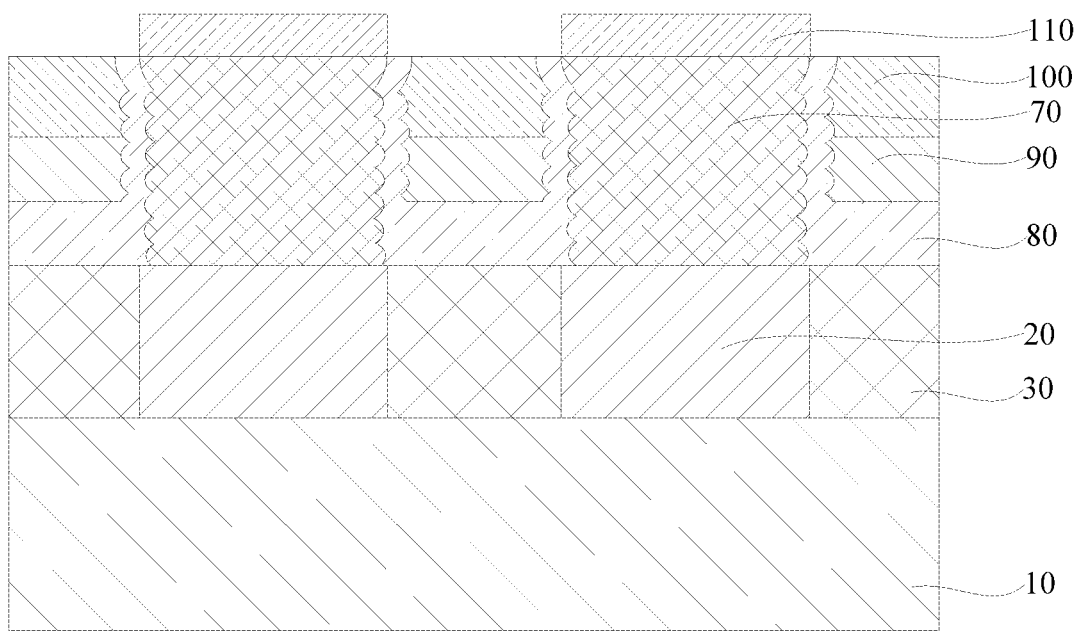
FIG. 18 is a schematic diagram of forming a metal layer in a method of manufacturing a semiconductor structure according to an exemplary embodiment.

For example, in step S150, as shown in FIG. 17 and FIG. 18, an initial metal layer 111 is formed on a top surface of the retained first dielectric layer 100 and the top surface of each of the active pillars 70 by a physical vapor deposition process.

A part of the initial metal layer 111 is removed, and the corresponding initial metal layer 111 located the top surface of each of the active pillars 70 is removed, to form a metal layer 110.

Figure 19:
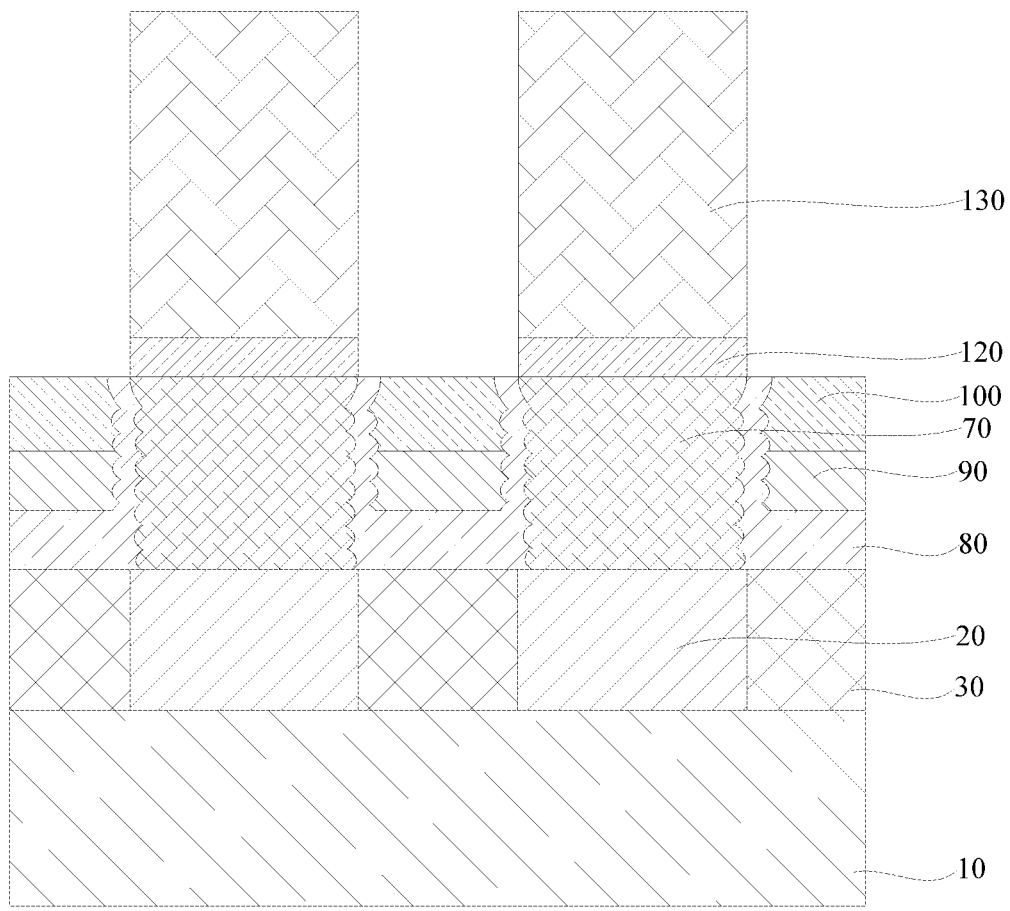
FIG. 19 is a schematic diagram of forming a contact layer and a capacitor structure in a method of manufacturing a semiconductor structure according to an exemplary embodiment.

As shown in FIG. 19, high-temperature tempering is performed on the metal layer 110 to form a metal silicide, i.e., the contact layer 120. The metal layer 110 includes at least one of a cobalt layer, a nickel layer or a platinum layer. The contact layer 120 includes at least one of a cobalt compound, a nickel compound or a platinum compound.

For example, in step S160, as shown in FIG. 19, the capacitor structure 130 is formed on the contact layer 120, where the capacitor structure may include a columnar capacitor structure, a cup-shaped capacitor structure or a trench-type capacitor structure.

In the method of manufacturing a semiconductor structure provided by the embodiments of the present disclosure, a concave-convex surface is formed on the outer surface layer of each of the active pillars, to increase the specific surface area of the gate oxide layer and improve the control capability of the gate, thus improving the performance of the semiconductor structure.

Figure 21:
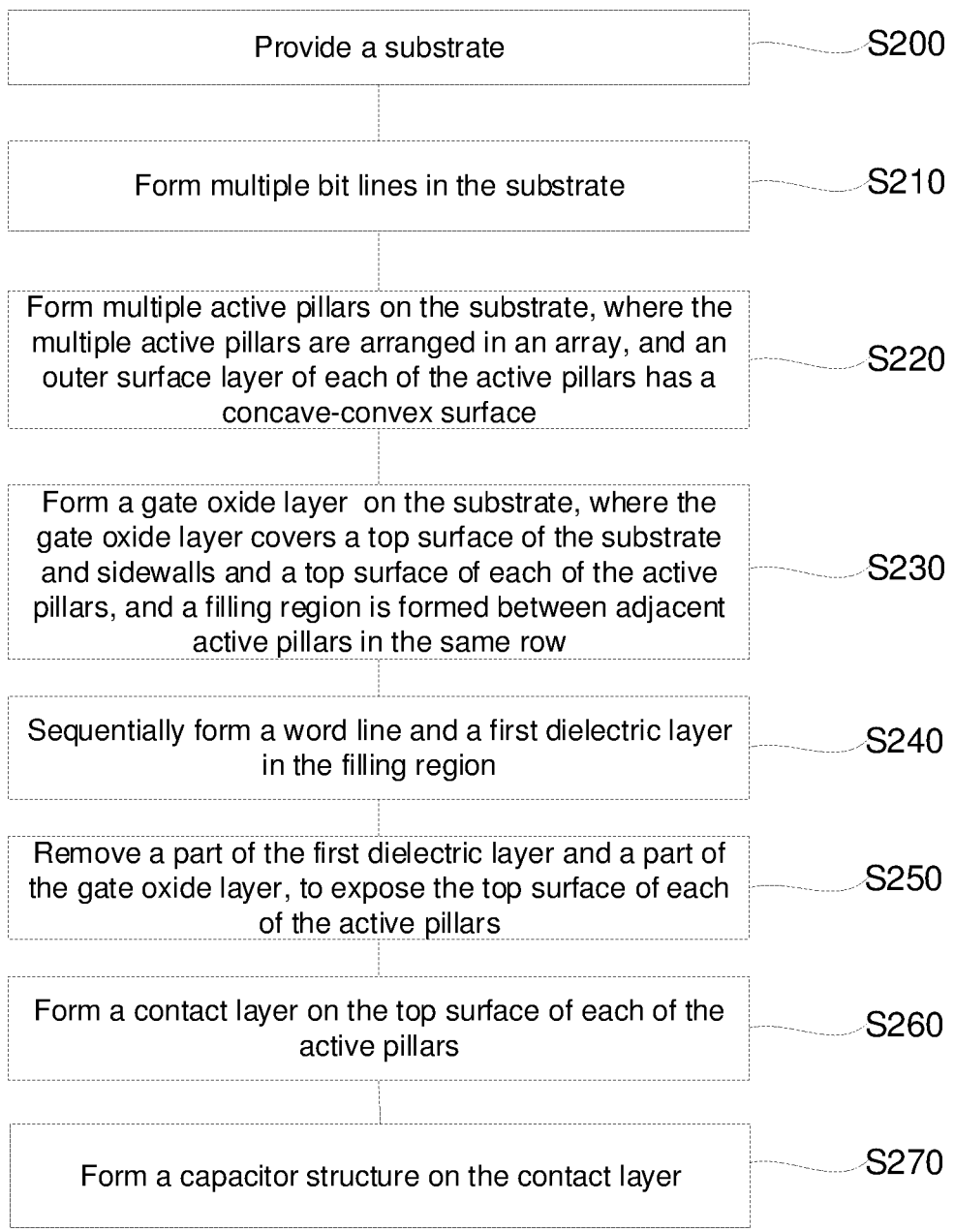
FIG. 21 is a flowchart of a method of manufacturing a semiconductor structure according to an exemplary embodiment.

As shown in FIG. 21, an embodiment of the present application provides a method of manufacturing a semiconductor structure, which includes the following steps:

Step S200: Provide a substrate.

Step S210: Form multiple bit lines in the substrate.

Step S220: Form multiple active pillars on the substrate, where the multiple active pillars are arranged in an array, and an outer surface layer of each of the active pillars has a concave-convex surface.

Step S230: Form a gate oxide layer on the substrate, where the gate oxide layer covers a top surface of the substrate and sidewalls and a top surface of each of the active pillars, and a filling region is formed between two adjacent active pillars in the same row.

Step S240: Sequentially form a word line and a first dielectric layer in the filling region.

Step S250: Remove a part of the first dielectric layer and a part of the gate oxide layer, to expose the top surface of each of the active pillars.

Step S260: Form a contact layer on the top surface of each of the active pillars.

Step S270: Form a capacitor structure on the contact layer.

Figure 3:
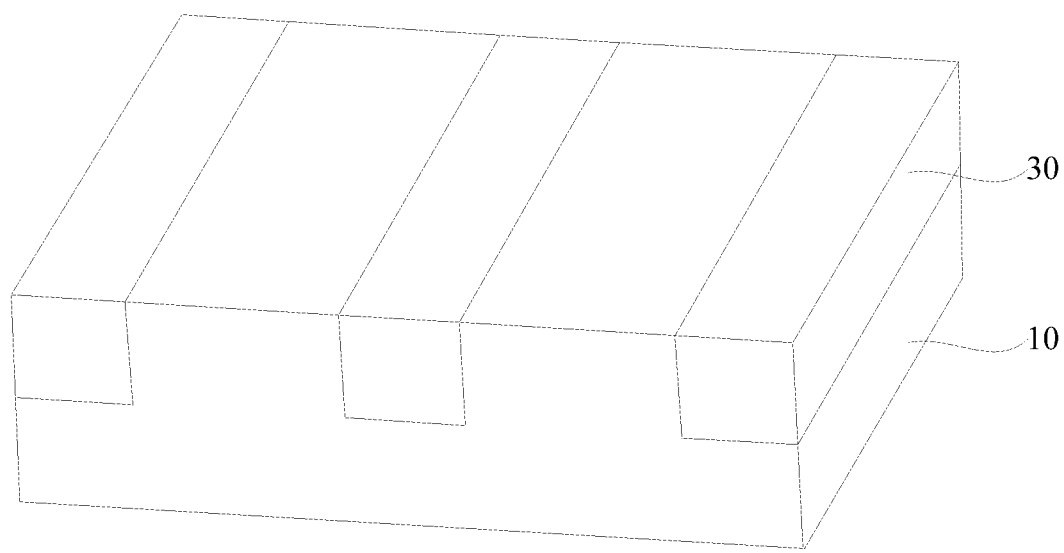
FIG. 3 is a schematic diagram of forming an insulating dielectric layer in a method of manufacturing a semiconductor structure according to an exemplary embodiment.
Figure 4:
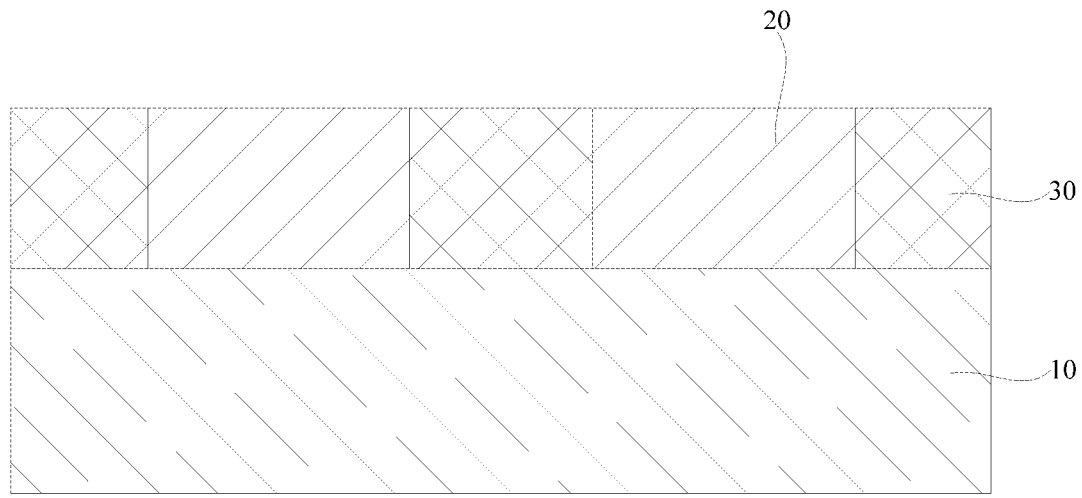
FIG. 4 is a schematic diagram of forming bit lines in a method of manufacturing a semiconductor structure according to an exemplary embodiment.

For example, in step S210, as shown in FIG. 2 to FIG. 4, a mask layer can be formed on the substrate 10 by a deposition process, and then the mask layer is patterned to form multiple mask openings that are arranged at intervals along the row direction of the multiple active pillars 70.

A first photoresist layer may be formed on the mask layer, and a mask pattern is formed on the first photoresist layer by exposure or development etching. A part of the third mask layer is removed by using the first photoresist layer with the mask pattern as a mask plate, to form multiple mask openings arranged at intervals.

In this embodiment, by transferring the mask pattern to the mask layer and then etching the substrate 10 by using the mask layer as the mask plate, the accuracy of the pattern transfer and the performance of the semiconductor structure can be improved.

After the mask openings are formed, the substrate 10 exposed in each mask opening is removed by using an etching solution or etching gas to form multiple first grooves 101 in the substrate 10.

After the first grooves 101 are formed, the mask layer retained on the top surface of the substrate 10 is removed.

An insulating dielectric layer 30 is then formed in each of the first grooves 101 by physical vapor deposition, chemical vapor deposition, spin coating or a combination thereof, where the top surface of the insulating dielectric layer 30 is flush with the top surface of the substrate 10. A material used to form the insulating dielectric layer 30 may be, for example, silicon oxide, silicon nitride or other suitable insulating substances (e.g., organic polymer compounds) or a combination of the above materials. A region between adjacent part of the insulating dielectric layer 30 forms an active region.

Then, doped ions can be injected into each of the active regions by ion implantation. The doped ions include one of the following: nitrogen ions, phosphorus ions, boron ions or germanium ions, etc., thus forming the bit lines 20.

In this embodiment, the active pillars 70 are subsequently formed on the top surfaces of the bit lines 20. That is, the bottom of each of the active pillars 70 is connected to the top of each of the bit lines 20.

It should be noted that step S200 in this embodiment is the same manner as step S100 in the foregoing embodiment, and step S220 to step S270 in this embodiment are the same manner as step S110 to step S160 of the foregoing embodiment; details will not be described again in this embodiment.

In the method of manufacturing a semiconductor structure provided by the embodiments of the present disclosure, a concave-convex surface is formed on the outer surface layer of each of the active pillars, to increase the specific surface area of the gate oxide layer and improve the control capability of the gate, thus improving the performance of the semiconductor structure.

Figure 20:
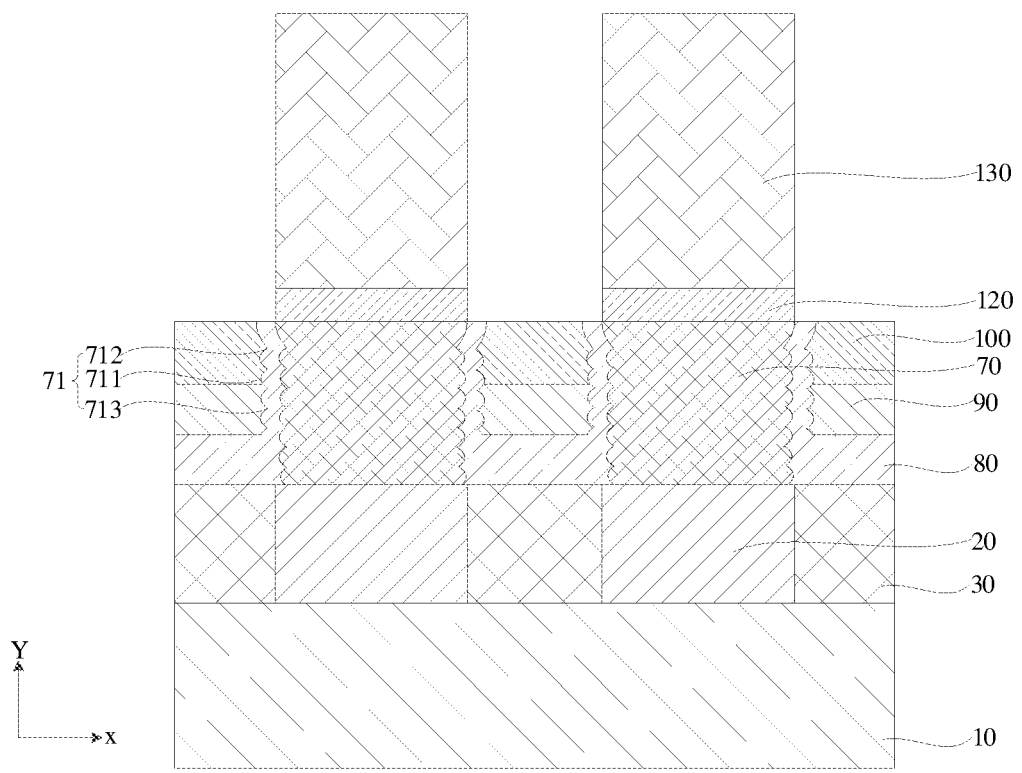
FIG. 20 is a schematic diagram of a semiconductor structure according to an exemplary embodiment.

As shown in FIG. 20, an embodiment of the present disclosure further provides a semiconductor structure. The semiconductor structure includes a substrate 10 and multiple active pillars 70. The multiple active pillars 70 are arranged in an array on the substrate 10, where an outer surface layer of each of the active pillars 70 has a concave-convex surface. As shown in FIG. 20, along a first direction, i.e., direction Y shown in FIG. 20, the concave-convex surface includes multiple circular arc bumps 71 that are sequentially connected.

In some embodiments, each of the circular arc bumps 71 includes a bump portion 711 as well as a first connection portion 712 and a second connection portion 713 that are provided on both sides of the bump portion 711, where a projection area of the bump portion 711 on the substrate 10 is larger than a projection area of the first connection portion 712 and the second connection portion 713 on the substrate 10, and the first connection portion 712 of one circular arc bump 71 is connected to the second connection portion 713 of an adjacent circular arc bump 71. Projection of the first connection portion 712 on the substrate 10 overlaps with projection of the second connection portion 713 on the substrate 10. The multiple circular arc bumps 71 are sequentially connected, to effectively increase the specific surface area of the outer surface of each of the active pillars 70, such that a subsequently formed gate oxide layer 80 has a larger specific surface area, thereby improving the control capability of the gate of the semiconductor structure and improving the performance of the semiconductor structure.

In some embodiments, the semiconductor structure further includes multiple bit lines 20 in the substrate 10. The multiple bit lines 20 are arranged at intervals along a row direction of the active pillars 70, that is, direction X shown in FIG. 20, where the top surface of the bit line 20 is connected to the bottom surface of the active pillar 70.

It should be noted that, in this embodiment, the row direction of the active pillars 70 may be direction X shown in FIG. 20, and the first direction may be direction Y shown in FIG. 20.

In some embodiments, the semiconductor structure further includes multiple word lines 90 arranged at intervals along a column direction of the active pillars 70, and each of the word lines 90 connects multiple active pillars 70 in the same row. A gate oxide layer 80 is provided between the word lines 90 and the active pillars 70, and an insulating dielectric layer 30 is provided between the gate oxide layer 80 and the substrate 10.

In some embodiments, a contact layer 120 is provided on the top surface of each of the active pillar 70, and a capacitor structure 130 is connected to the contact layer 120.

In the semiconductor structure provided by the embodiments of the present disclosure, a concave-convex surface is formed on the outer surface layer of each of the active pillars, to increase the specific surface area of the gate oxide layer and improve the control capability and short-channel control capability of the gate, thus improving the performance of the semiconductor.

The embodiments or implementations of this specification are described in a progressive manner, and each embodiment focuses on differences from other embodiments. The same or similar parts between the embodiments may refer to each other.

In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

In the method of manufacturing a semiconductor structure and the semiconductor structure provided by the embodiments of the present disclosure, a concave-convex surface is formed on the outer surface layer of each of the active pillars, which increases the specific surface area of the gate oxide layer and improves the control capability of the gate, thus improving the performance of the semiconductor structure.

The invention claimed is:

1. A method of manufacturing a semiconductor structure, comprising:
   providing a substrate;
   forming multiple active pillars on the substrate, wherein the multiple active pillars are arranged in an array, and an outer surface layer of each of the active pillars has a concave-convex surface;
   forming a gate oxide layer on the substrate, wherein the gate oxide layer covers a top surface of the substrate and sidewalls and a top surface of each of the active pillars, and a filling region is formed between two adjacent active pillars in the same row;
   sequentially forming a word line and a first dielectric layer in the filling region;
   removing a part of the first dielectric layer and a part of the gate oxide layer, to expose the top surface of each of the active pillars;
   forming a contact layer on the top surface of each of the active pillars; and
   forming a capacitor structure on the contact layer.

2. The method of manufacturing a semiconductor structure according to claim 1, wherein along a first direction, the concave-convex surface comprises multiple circular arc bumps that are sequentially connected.

3. The method of manufacturing a semiconductor structure according to claim 2, wherein after the step of providing a substrate and before the step of forming multiple active pillars on the substrate, the method of manufacturing a semiconductor structure further comprises:
   forming multiple bit lines in the substrate, wherein the multiple bit lines are arranged at intervals in the substrate along a row direction of the active pillars, and a top surface of each of the bit lines is flush with the top surface of the substrate.

4. The method of manufacturing a semiconductor structure according to claim 3, wherein the step of forming multiple bit lines in the substrate comprises:
   forming multiple first grooves that are arranged at intervals in the substrate along the row direction of the active pillars;
   forming an insulating dielectric layer in the first grooves, wherein a top surface of the insulating dielectric layer is flush with the top surface of the substrate, and a region between two adjacent parts of the insulating dielectric layer forms an active region; and
   doping the active region with ions by ion implantation, to form the bit lines.

5. The method of manufacturing a semiconductor structure according to claim 4, wherein the step of forming multiple active pillars on the substrate comprises:
   sequentially forming an etching sacrificial layer and a photoresist layer, wherein the etching sacrificial layer and the photoresist layer are stacked on the substrate;
   removing a part of the photoresist layer and a part of the etching sacrificial layer, such that a retained photoresist layer and a retain etching sacrificial layer form multiple second grooves arranged at intervals, and each of the second grooves exposes a top surface of one bit line; and
   forming the active pillars in the second grooves, wherein the top surface of each of the active pillars is flush with a top surface of the etching sacrificial layer.

6. The method of manufacturing a semiconductor structure according to claim 5, wherein the step of removing a part of the photoresist layer and a part of the etching sacrificial layer, to form multiple second grooves arranged at intervals, and each of the second grooves exposes a top surface of one bit line, comprises:
   removing a part of the photoresist layer, such that a retained photoresist layer forms multiple third grooves arranged at intervals, wherein each of the third grooves exposes the top surface of the etching sacrificial layer; and
   removing the etching sacrificial layer exposed in each of the third grooves, such that a retained etching sacrificial layer forms the second groove.

7. The method of manufacturing a semiconductor structure according to claim 6, wherein the step of removing the etching sacrificial layer exposed in each of the third grooves to form the second groove comprises:
   removing the etching sacrificial layer exposed in each of the third grooves by a predetermined thickness to form a recess, wherein the recess is a semioval-shaped groove;
   forming a barrier layer in the recess;
   removing the barrier layer at a bottom of the recess, such that a retained barrier layer forms a first opening, wherein a bottom surface of the first opening exposes the etching sacrificial layer;
   removing the etching sacrificial layer exposed in the first opening by a predetermined thickness, to form a second opening, wherein a top surface of the etching sacrificial layer in the second opening is higher than the top surface of the substrate; and
   repeatedly removing the etching sacrificial layer in the second opening by a predetermined thickness until the top surface of the bit line is exposed, such that a retained etching sacrificial layer forms a concave-convex inner wall on an inner wall of the second groove.

8. The method of manufacturing a semiconductor structure according to claim 7, wherein the step of forming the active pillars in the second grooves comprises:
   forming the active pillars along the concave-convex inner walls by silicon epitaxial growth; and
   removing the retained photoresist layer and the retain etching sacrificial layer, such that the outer surface layer of each of the active pillars forms the concave-convex surface.

9. The method of manufacturing a semiconductor structure according to claim 1, wherein after the step of removing a part of the first dielectric layer and a part of the gate oxide layer to expose the top surface of each of the active pillars, and before the step of forming a contact layer on the top surface of each of the active pillars, the method of manufacturing a semiconductor structure further comprises:
   forming an initial metal layer on a top surface of the retained first dielectric layer and on the top surface of each of the active pillars;
   removing a part of the initial metal layer and retaining the initial metal layer located on the top surface of each of the active pillars, to form a metal layer; and
   performing high-temperature tempering process on the metal layer to form the contact layer.

10. The method of manufacturing a semiconductor structure according to claim 9, wherein the metal layer comprises at least one of a cobalt layer, a nickel layer or a platinum layer; and
   the contact layer comprises at least one of a cobalt compound, a nickel compound or a platinum compound.

11. A semiconductor structure, obtained by the method of manufacturing a semiconductor structure according to claim 1, comprising:
   a substrate; and
   multiple active pillars, wherein the multiple active pillars are arranged in an array on the substrate, and an outer surface layer of each of the active pillars has a concave-convex surface.

12. The semiconductor structure according to claim 11, wherein, along a first direction, the concave-convex surface comprises multiple circular arc bumps that are sequentially connected.

13. The semiconductor structure according to claim 12, wherein each of the circular arc bumps comprises a bump portion as well as a first connection portion and a second connection portion that are provided on both sides of the bump portion, and a projection area of the bump portion on the substrate is greater than a projection area of the first connection portion and the second connection portion on the substrate, wherein the first connection portion of one circular arc bump is connected to the second connection portion of an adjacent circular arc bump.

14. The semiconductor structure according to claim 13, wherein projection of the first connection portion on the substrate overlaps with projection of the second connection portion on the substrate.

15. The semiconductor structure according to claim 11, wherein the semiconductor structure further comprises multiple bit lines in the substrate, the multiple bit lines are arranged at intervals in the substrate along a row direction of the active pillars, and a top surface of the bit line is connected to a bottom surface of the active pillar.

16. The semiconductor structure according to claim 11, wherein the semiconductor structure further comprises multiple word lines that are arranged at intervals along a column direction of the active pillars, and each of the word lines connects multiple active pillars in the same row.

17. The semiconductor structure according to claim 11, wherein a contact layer is arranged on a top surface of each of the active pillars, and a capacitor structure is connected to the contact layer.

* * * * *